(12) United States Patent
Nakamura

(10) Patent No.: US 9,817,453 B2
(45) Date of Patent: Nov. 14, 2017

(54) COOLING DEVICE AND ELECTRONIC APPARATUS

(71) Applicant: FUJITSU LIMITED, Kawasaki-shi, Kanagawa (JP)

(72) Inventor: Naoaki Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/851,242

(22) Filed: Sep. 11, 2015

(65) Prior Publication Data
US 2016/0109913 A1    Apr. 21, 2016

(30) Foreign Application Priority Data
Oct. 15, 2014  (JP) .................................. 2014-210472

(51) Int. Cl.
*G06F 1/20* (2006.01)
*H05K 7/20* (2006.01)
(Continued)

(52) U.S. Cl.
CPC .............. *G06F 1/206* (2013.01); *F28F 3/12* (2013.01); *F28F 27/02* (2013.01); *G06F 1/20* (2013.01); *H01L 23/473* (2013.01); *H05K 7/20* (2013.01); *H05K 7/20254* (2013.01); *H05K 7/20509* (2013.01); *H05K 7/20518* (2013.01); *H05K 7/20927* (2013.01); *F28D 15/00* (2013.01); *G06F 2200/201* (2013.01)

(58) Field of Classification Search
CPC ...... G06F 1/206; H05K 7/20; H05K 7/20509; H05K 7/20518; H05K 7/20927; H05K 7/20254

USPC ................................. 361/361, 257, 165, 439
See application file for complete search history.

(56) References Cited

U.S. PATENT DOCUMENTS 4,293,003 A * 10/1981 Raetz .................. F16K 11/0746
137/605
4,360,040 A * 11/1982 Cove ......................... F16K 3/34
137/625.3
(Continued)

FOREIGN PATENT DOCUMENTS

JP      2001-044678 A      2/2001
JP      2006-516068 A      6/2006
JP      2007-227413 A      9/2007

*Primary Examiner* — Anatoly Vortman
(74) *Attorney, Agent, or Firm* — Squire Patton Boggs (US) LLP

(57) ABSTRACT

A cooling device that is thermally connected to a heat source and cools the heat source by means of a heat medium flowing inside the cooling device, includes: a first passage configured such that the heat medium before being heated by the heat source flows through the first passage; a second passage configured such that the heat medium after being heated by the heat source flows through the second passage; a plurality of heat exchanging chambers each configured such that in the heat exchanging chamber, the heat medium is heated by heat generated by the heat source; a first communicating passage provided in each of the plurality of heat exchanging chambers and configured such that through the first communicating passage, the first passage and the heat exchanging chamber communicate with each other; a second communicating passage provided in each of the plurality of heat exchanging chambers.

14 Claims, 15 Drawing Sheets

(51) Int. Cl.
    *F28F 3/12*    (2006.01)
    *F28F 27/02*   (2006.01)
    *H01L 23/473*  (2006.01)
    *F28D 15/00*   (2006.01)

(56) References Cited

U.S. PATENT DOCUMENTS

| | | | | |
|---|---|---|---|---|
| 4,485,429 | A * | 11/1984 | Mittal | F28F 3/022 165/104.33 |
| 5,016,090 | A * | 5/1991 | Galyon | H01L 23/4336 257/714 |
| 5,179,500 | A * | 1/1993 | Koubek | H01L 23/427 165/104.14 |
| 5,388,635 | A * | 2/1995 | Gruber | F28F 3/12 165/185 |
| 5,978,220 | A * | 11/1999 | Frey | H01L 23/473 165/80.4 |
| 6,101,715 | A * | 8/2000 | Fuesser | H01C 1/082 165/104.33 |
| 6,578,626 | B1 * | 6/2003 | Calaman | F28F 3/022 165/170 |
| 7,104,312 | B2 * | 9/2006 | Goodson | F04B 19/006 165/104.33 |
| 7,331,378 | B2 * | 2/2008 | Bhatti | F28F 9/026 165/80.4 |
| 2003/0062149 | A1 * | 4/2003 | Goodson | F04B 19/006 165/104.11 |
| 2004/0112585 | A1 | 6/2004 | Goodson et al. | |
| 2012/0320529 | A1 * | 12/2012 | Loong | H01L 23/3735 361/702 |
| 2014/0204532 | A1 * | 7/2014 | Mehring | H05K 7/20 361/689 |

\* cited by examiner

COOLING DEVICE AND ELECTRONIC APPARATUS

CROSS-REFERENCE TO RELATED APPLICATION

This application is based upon and claims the benefit of priority of the prior Japanese Patent Application No. 2014-210472, filed on Oct. 15, 2014, the entire contents of which are incorporated herein by reference.

FIELD

The embodiments discussed herein are related to, for example, a cooling device and an electronic apparatus including a cooling device.

BACKGROUND

Significant increase in performance of electronic apparatuses such as computers in recent years has also been increasing the amounts of heat generated by semiconductor devices such as central processing units (CPUs). An air-cooling system and a water-cooling system are used for cooling semiconductor devices. To cool a semiconductor device that generates a large amount of heat, the water-cooling system is often employed.

The cooling device of the water-cooling system is designed as follows. A cooling device, which is called as a cooling plate, is attached to an upper surface (hereinafter, referred to as a "heat radiating surface") of a semiconductor device, and a heat dissipating device is disposed at a position separated from the cooling device. The cooling device and the heat dissipating device are connected by a pipe (or a tube). A flow passage through which a coolant flows is provided inside the cooling device. The coolant is thus circulated between the cooling device and the heat dissipating device through the flow passage, thereby transporting heat generated by the semiconductor device to the heat dissipating device. The heat is thus dissipated from the heat dissipating device to the atmosphere. Note that in the present application, water or another fluid (heat medium) used for transporting heat from the cooling device to the heat dissipating device is referred to as a coolant.

A general cooling device is provided with a flow passage arranged such that a coolant flows in a zigzag fashion along a heat radiating surface of a semiconductor device, cooling the entire heat radiating surface of the semiconductor device (such a technique is disclosed, for example, in Japanese Laid-open Patent Publication No. 2001-44678). Moreover, another cooling device is proposed which is provided with a flow passage arranged such that a coolant flows in a direction perpendicular to a heat radiating surface of a semiconductor device (such a technique is disclosed, for example, in Published Japanese National Publication of International Patent Application No. 2006-516068).

Furthermore, it is proposed that a thermoelectric conversion element is used to generate electricity from heat generated by a semiconductor device for use as a power source for causing a coolant to flow (such a technique is disclosed, for example, in Japanese Laid-open Patent Publication Nos. 2001-44678 and 2007-227413).

SUMMARY

In accordance with an aspect of the embodiments, a cooling device that is thermally connected to a heat source and cools the heat source by means of a heat medium flowing inside the cooling device, includes: a first passage configured such that the heat medium before being heated by the heat source flows through the first passage; a second passage configured such that the heat medium after being heated by the heat source flows through the second passage; a plurality of heat exchanging chambers each configured such that in the heat exchanging chamber, the heat medium is heated by heat generated by the heat source; a first communicating passage provided in each of the plurality of heat exchanging chambers and configured such that through the first communicating passage, the first passage and the heat exchanging chamber communicate with each other; a second communicating passage provided in each of the plurality of heat exchanging chambers and configured such that through the second communicating passage, the heat exchanging chamber and the second passage communicate with each other; and a flow regulating mechanism provided in each of the plurality of heat exchanging chambers and configured to regulate, according to a temperature, a flow rate of the heat medium flowing through at least one of the first communicating passage and the second communicating passage.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENTS

Hereinafter, preliminary matters for facilitating the understanding of embodiments are described before description of embodiments.

Figure 1:
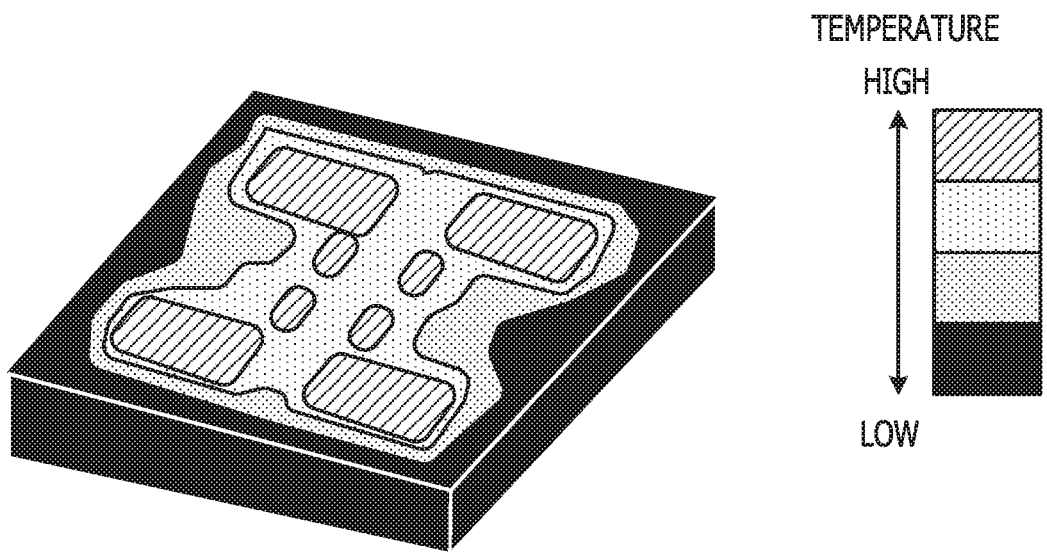
FIG. 1 is a diagram illustrating an example of temperature distribution on a heat radiating surface of a semiconductor device (LSI) in operation.

In a semiconductor device such as a CPU, portions where the heat generation density largely changes due to the operation and portions where the heat generation density is relatively low and hardly changes are mixedly present. FIG. 1 is a diagram illustrating an example of temperature distribution on a heat radiating surface of a semiconductor device (LSI) in operation.

As illustrated in FIG. 1, an in-plane temperature distribution in the heat radiating surface of the semiconductor device in operation is not uniform, and there are portions having high heat generation densities and portions having low heat generation densities. The portion having a particularly high heat generation density in the heat radiating surface is called a hot spot. In the example illustrated in FIG. 1, four hot spots have occurred in the heat radiating surface.

In a conventional general cooling method, the flow rate of a coolant, which circulates between a cooling device and a heat dissipating device, is regulated such that the temperature of a portion having the highest heat generation density becomes equal to or lower than a preset temperature. Thus, an amount of the coolant that is sufficient to cool the hot spots is circulated between the cooling device and the heat dissipating device, which causes portions other than the hot spots to be excessively cooled.

A computing machine called a super computer uses a large number of CPUs, and thus consumes a large amount of electricity for cooling the CPUs. Thus, there is a demand for reduction in electricity to be used in such a super computer from the perspective of energy conservation. Therefore, there is a desire for a cooling device capable of efficiently cooling a semiconductor device that generates a large amount of heat.

(First Embodiment)

Figure 2:
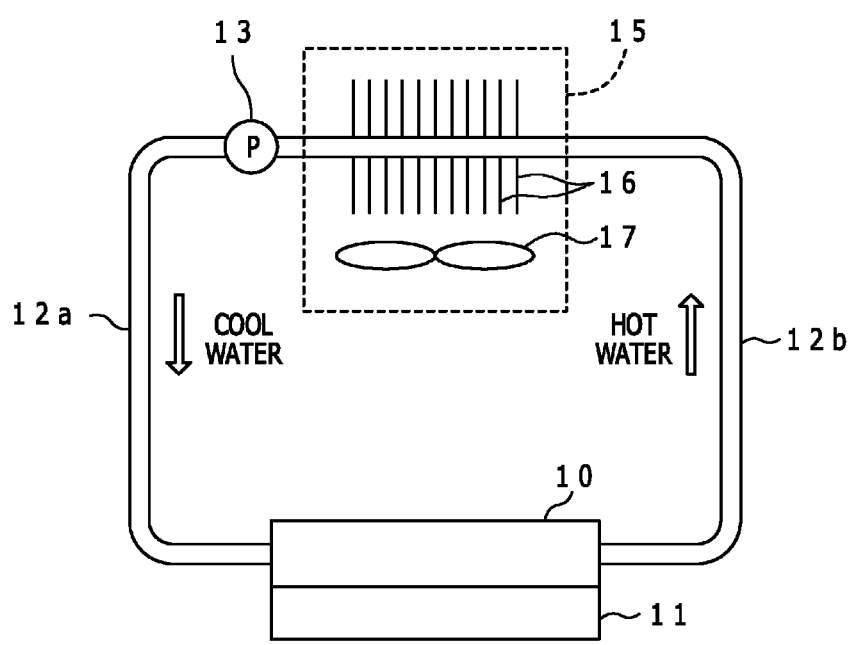
FIG. 2 is a schematic view illustrating an example of an electronic apparatus including a cooling device according to a first embodiment.

FIG. 2 is a schematic view illustrating an example of an electronic apparatus including a cooling device according to a first embodiment.

The electronic apparatus according to the first embodiment includes: a semiconductor device 11 such as a CPU; a cooling device 10; a heat dissipating device 15; and pipes 12a and 12b. Note that the semiconductor device 11 is an example of a heat source.

The cooling device 10 has an appearance of a rectangular thin plate shape having a thickness of about 5 mm to 10 mm, for example. The cooling device 10 is disposed on the semiconductor device 11, as illustrated in FIG. 2. Main part of the cooling device 10 is formed of a metal such as copper or aluminum, for example. In addition, the cooling device 10 is provided with a coolant inlet (not illustrated) and a coolant outlet (not illustrated) to be connected with the pipes 12a and 12b. Moreover, the cooling device 10 is provided inside with a space through which the coolant flows, as described later.

The heat dissipating device 15 is disposed at a position separated from the cooling device 10. The heat dissipating device 15 and the cooling device 10 are connected by the pipes 12a and 12b. In the example illustrated in FIG. 2, a circulating pump 13 is provided in the middle of the pipe 12a. The circulating pump 13 circulates the coolant between the heat dissipating device 15 and the cooling device 10.

Heat generated in the semiconductor device 11 is absorbed by the coolant flowing through the cooling device 10. The coolant which has absorbed the heat generated in the semiconductor device 11 and thus has an increased temperature (hot water) is transported through the pipe 12b to the heat dissipating device 15.

The heat dissipating device 15 is provided with dissipating fins 16 and a blower 17. The heat of the coolant transported from the cooling device 10 is dissipated to the atmosphere by the dissipating fins 16 and the blower 17. In this way, the temperature of the coolant is lowered, and the coolant having a low temperature (cool water) is outputted from the heat dissipating device 15. The coolant outputted from the heat dissipating device 15 is sent through the pipe 12a to the cooling device 10 by the circulating pump 13.

Figure 3:
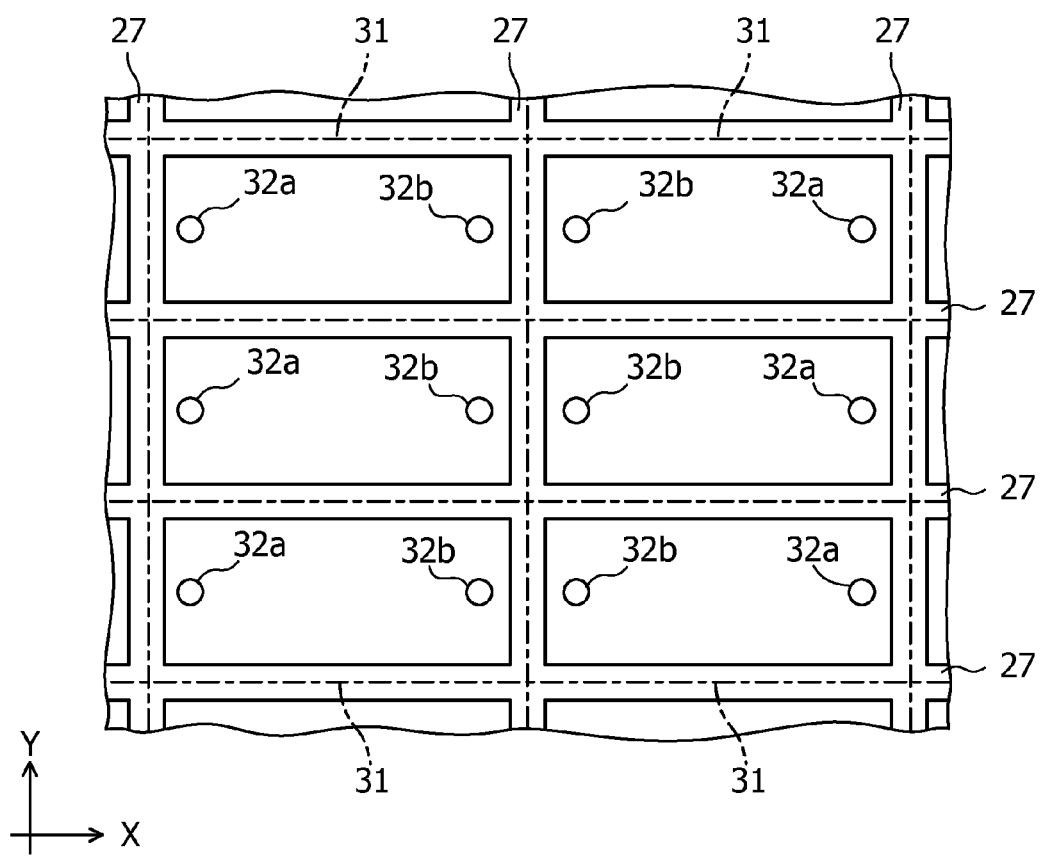
FIG. 3 is a schematic top view illustrating an internal structure of the cooling device according to the first embodiment.
Figure 4:
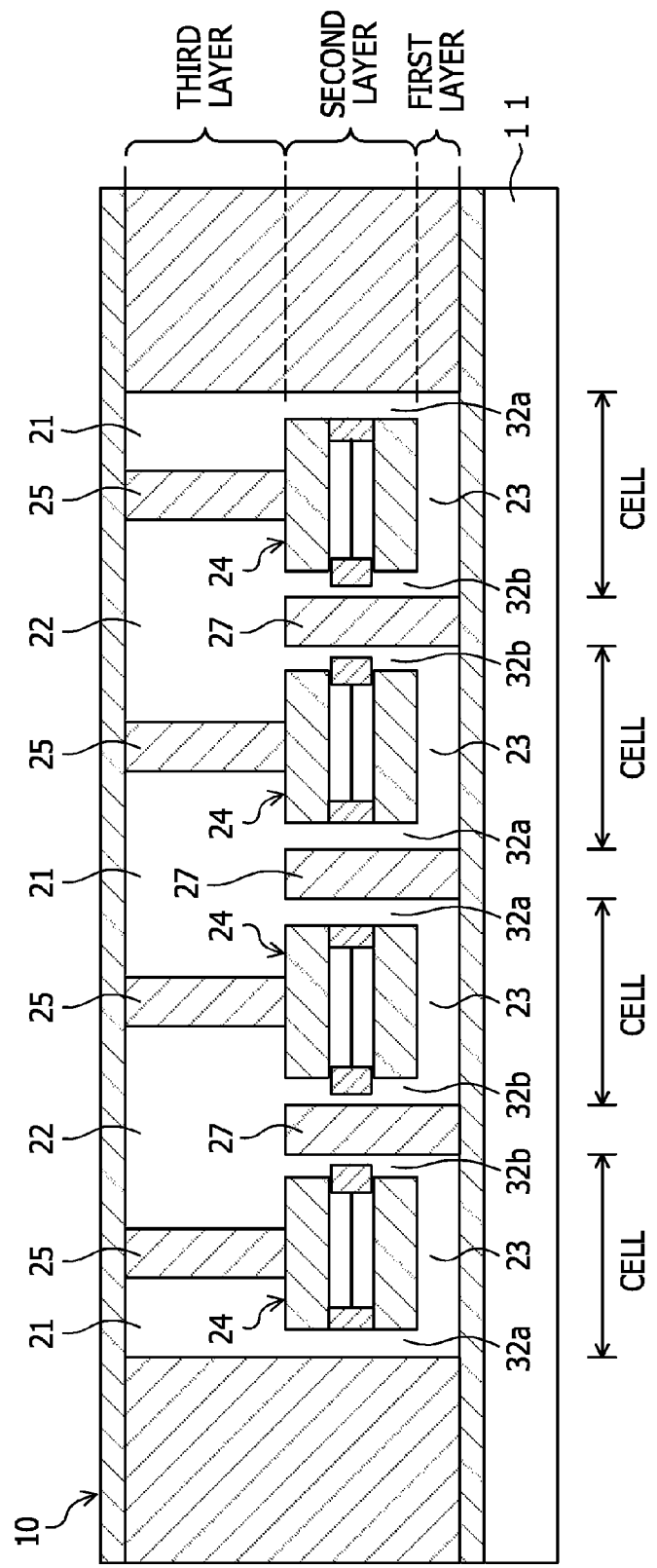
FIG. 4 is a schematic cross-sectional view illustrating the internal structure of the cooling device according to the first embodiment.

FIG. 3 is a schematic top view illustrating an internal structure of the cooling device 10, and FIG. 4 is a schematic cross-sectional view illustrating the same.

As illustrated in the schematic top view of FIG. 3, the cooling device 10 is partitioned into a plurality of rectangular areas arranged in two-dimensional directions (X direction and Y direction). Here, each of the rectangular areas illustrated in FIG. 3 is called a cell 31. Each adjacent two cells 31 are separated by a partition wall 27.

Although the partition wall 27 is provided between each adjacent cells 31 in the first embodiment, a structure may be employed in which a cell group is formed of a plurality of (for example, 2 to 6) cells 31 and no partition wall 27 is provided between the cells 31 in the same cell group.

Each cell 31 is provided with a first communicating passage 32a, through which a cool water passage 21, as described later, and the heat exchanging chamber 23 communicate with each other, and a second communicating passage 32b, through which the heat exchanging chamber 23 and a hot water passage 22 communicate with each other. The first communicating passage 32a is disposed on one side of the cell 31 in a longitudinal direction thereof, and the second communicating passage 32b is disposed on the opposite side of the cell 31 in the longitudinal direction.

As illustrated in a schematic cross-sectional view of FIG. 4, the inside of the cooling device 10 is divided into three layers in a thickness direction (height direction).

The uppermost layer (third layer) is provided with the cool water passage (first passage) 21 through which the cool water flows and the hot water passage (second passage) 22 through which the hot water flows. The cool water passage 21 and the hot water passage 22 are separated by a separating wall 25. The cool water passage 21 communicates with the aforementioned coolant inlet, and the hot water passage 22 communicates with the aforementioned coolant outlet.

The lowermost layer (first layer) is provided with the heat exchanging chamber 23 in which the cool water is heated by heat transmitted from the heat radiating surface of the semiconductor device 11 to be changed to the hot water. The heat exchanging chamber 23 is provided in each cell 31 or cell group, and the heat exchanging chambers 23 adjacent to each other are separated by the partition wall 27.

The intermediate layer (second layer) is provided with the aforementioned first communicating passage 32a and second communicating passage 32b as well as a flow regulating mechanism 24 configured to regulate the flow rate of the hot water flowing through the second communicating passage 32b.

Figure 5:
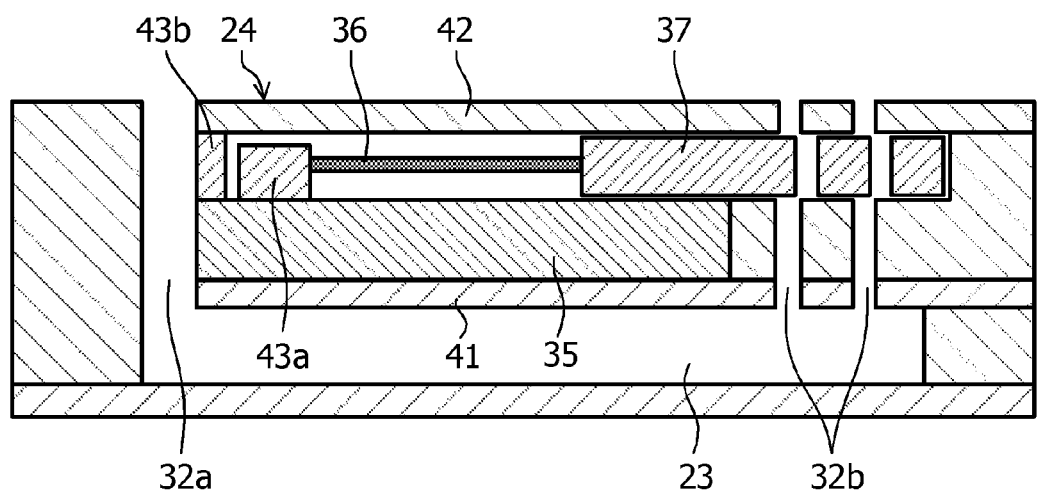
FIG. 5 is a schematic cross-sectional view illustrating detail of a flow regulating mechanism.

FIG. 5 is a schematic cross-sectional view illustrating detail of the flow regulating mechanism 24.

As illustrated in FIG. 5, the flow regulating mechanism 24 includes: a lower plate 41 and an upper plate 42; and a power generating element 35, an actuator 36, and a movable plate 37 which are disposed between the lower plate 41 and the upper plate 42. Each of the lower plate 41 and the upper plate 42 is provided with a plurality of holes each used as the second communicating passage 32b.

The power generating element 35 is disposed on the lower plate 41. In the first embodiment, a thermoelectric conversion element which generates electricity by utilizing the Seebeck effect is used as the power generating element 35. The structure of the thermoelectric conversion element is publicly known and is thus not described herein. The power generating element 35 generates a voltage corresponding to a temperature difference in between the cool water flowing through the first communicating passage 32a and the hot water flowing through the second communicating passage 32b.

Figure 6A:
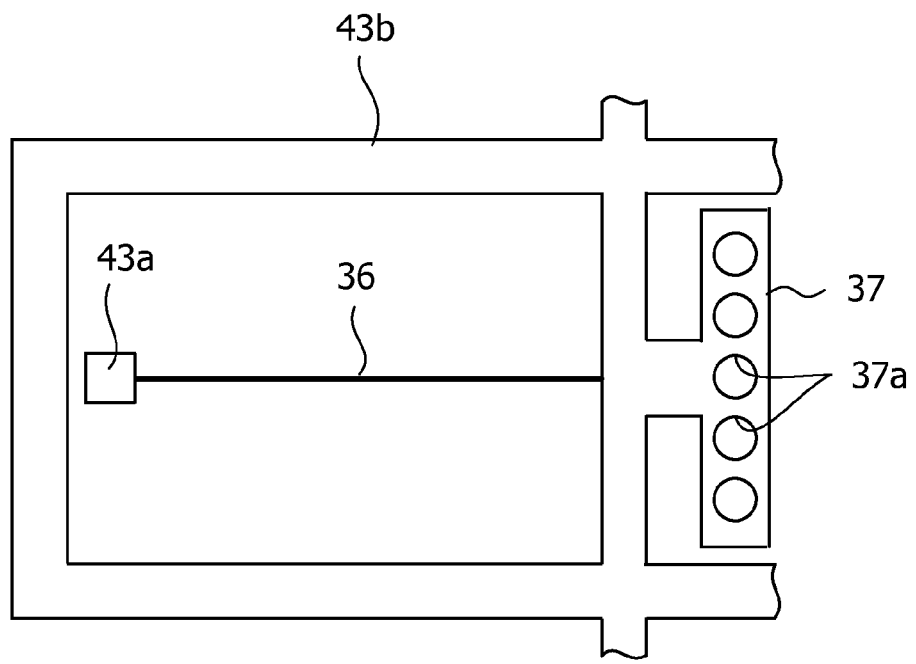
FIGS. 6A and 6B are plan views illustrating an actuator, a fixed portion, a thin frame, and a movable plate disposed on a power generating element.

As illustrated in a plan view of FIG. 6A, the actuator 36, a fixed portion 43a, a thin frame (frame) 43b, and a movable plate 37 are disposed on the power generating element 35. The fixed portion 43a is disposed on the first communicating passage 32a side, and the movable plate 37 is disposed on the second communicating passage 32b side. In addition, the movable plate 37 and the thin frame 43b are formed integrally of a metal thin plate. Moreover, the movable plate 37 is provided with a plurality of holes 37a.

The actuator 36 is a wire-like member, and is connected between the fixed portion 43a and the movable plate 37. In the first embodiment, what is called as an artificial muscle is used as the actuator 36. The actuator 36 is contracted by applying a voltage between the opposite ends of the actuator 36 in the longitudinal direction. The Biometal (registered trademark) available from TOKI Corporation, for example, may be used as the actuator 36.

The voltage generated by the aforementioned power generating element 35 is applied between the opposite ends of the actuator 36 through the fixed portion 43a, the thin frame 43b, and the movable plate 37.

Figure 6B:
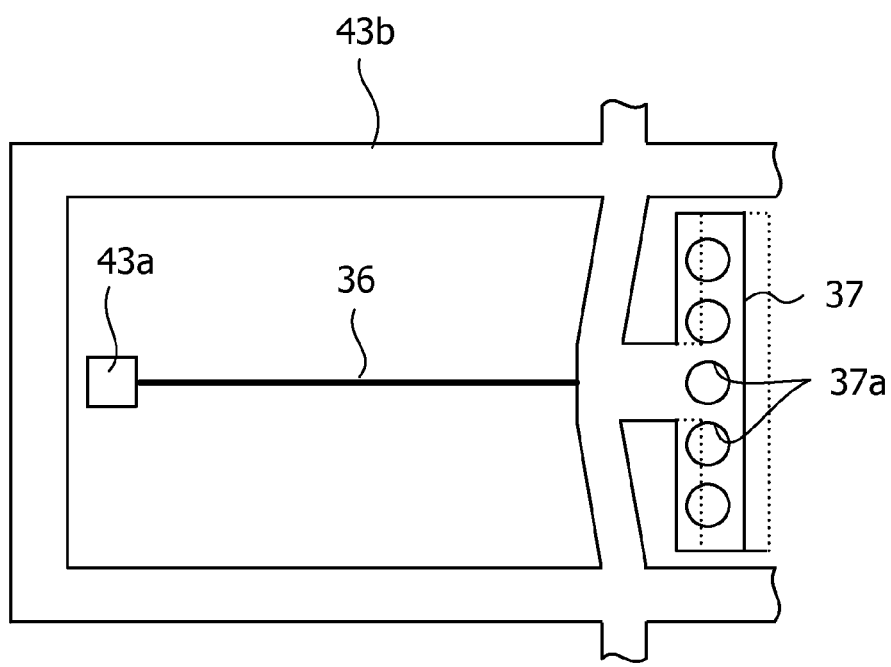

The movable plate 37 is driven by the actuator 36 to move along the surface of the upper plate 42 under the upper plate 42. In conjunction with the movement of the movable plate 37, a portion of the thin frame 43b which is connected to the movable plate 37 is elastically deformed as illustrated in FIG. 6B.

Figure 7A:
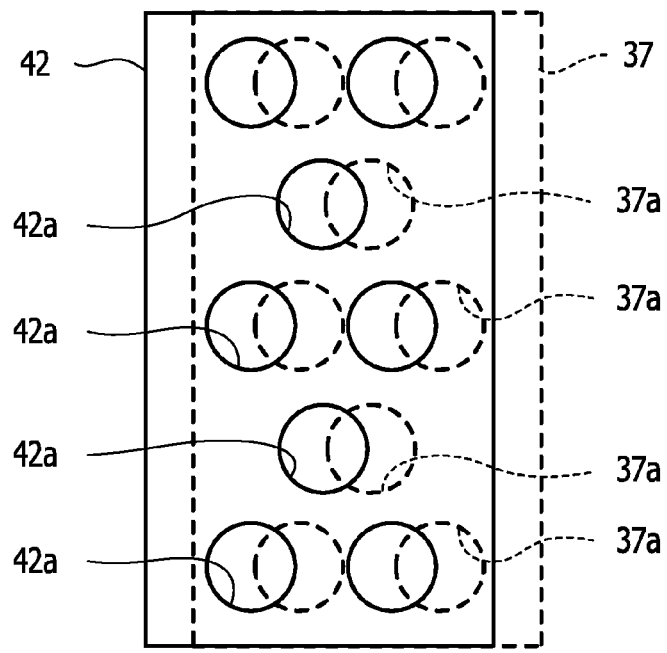
FIGS. 7A and 7B are schematic views illustrating how holes of an upper plate and holes of the movable plate overlap.
Figure 7B:
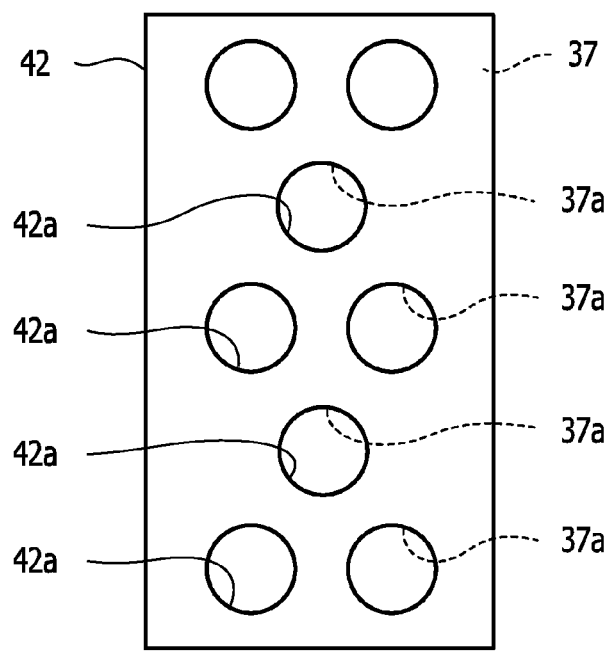

FIGS. 7A and 7B are schematic views illustrating how the holes 42a of the upper plate 42 and the holes 37a of the movable plate 37 overlap.

When the temperature difference between the coolant (cool water) flowing through the first communicating passage 32a and the coolant (hot water) flowing through the second communicating passage 32b is small, the voltage outputted from the power generating element 35 is 0 V or almost 0 V. In this case, the actuator 36 is in an extended state as illustrated in FIG. 6A, and the holes 42a of the upper plate 42 and the holes 37a of the movable plate 37 are in a partially overlapping state as illustrated in FIG. 7A. At this time, the flow rate of the coolant flowing through the second communicating passage 32b is minimum.

On the other hand, when the temperature difference between the coolant (cool water) flowing through the first communicating passage 32a and the coolant (hot water) flowing through the second communicating passage 32b is increased to a certain level, a sufficiently high voltage is outputted from the power generating element 35. In this case, the actuator 36 is in a contracted state as illustrated in FIG. 6B, and the holes 42a of the upper plate 42 and the holes 37a of the movable plate 37 are in a fully overlapping state as illustrated in FIG. 7B. At this time, the flow rate of the coolant flowing through the second communicating passage 32b is maximum.

Hereinafter, the sum of areas of portions where the holes 42a of the upper plate 42 and the holes 37a of the movable plate 37 overlap is referred to as an opening area of the second communicating passage 32b.

Figure 8:
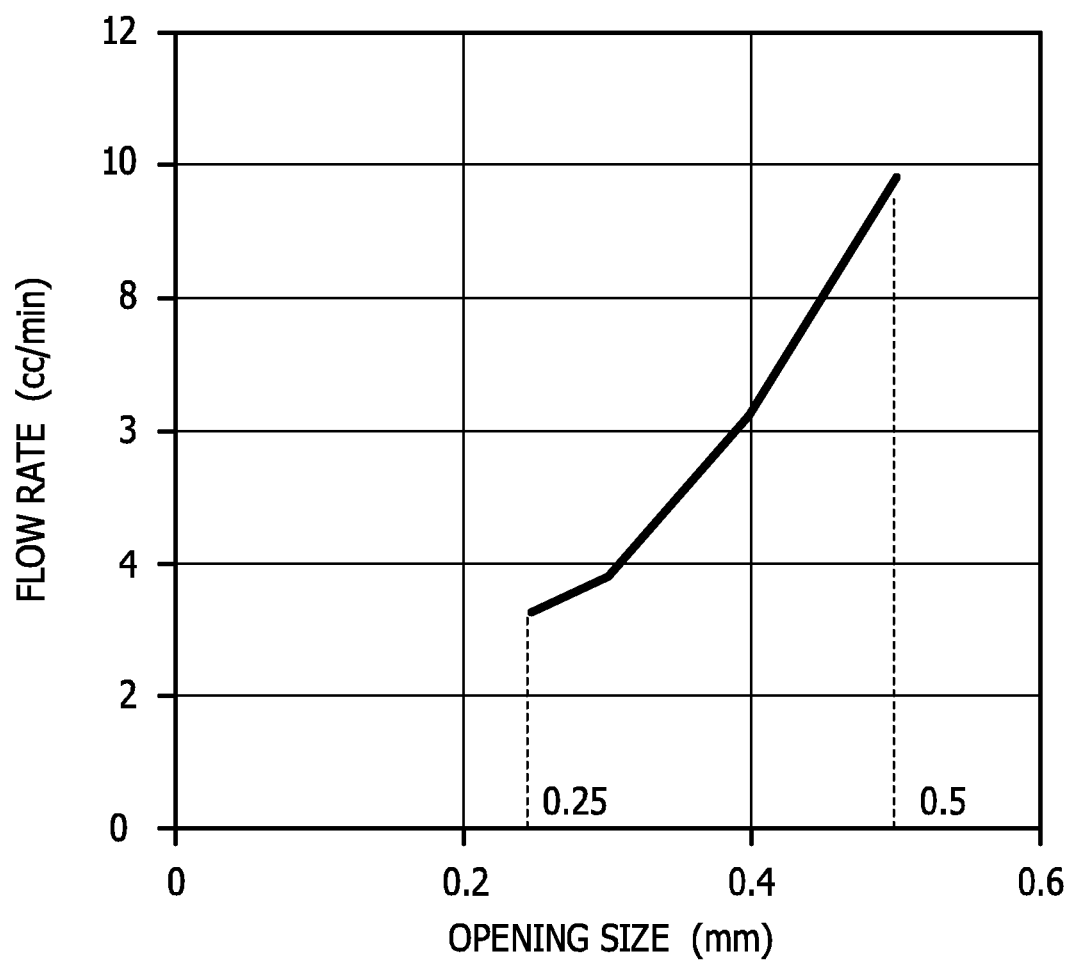
FIG. 8 is a graph illustrating a relationship between an opening area of a second communicating passage and a flow rate of a coolant flowing through the second communicating passage.

FIG. 8 is a graph illustrating a result of simulation calculation conducted on the relation between the opening area of the second communicating passage 32b and the flow rate of the coolant flowing through the second communicating passage 32b, where the horizontal axis indicates the opening size and the vertical axis indicates the flow rate. It may be understood from FIG. 8 that the flow rate of the coolant changes in a range from approximately 3 cc/min to approximately 10 cc/min when the opening area of the second communicating passage 32b is changed in a range from 0.05 mm$^2$ (=(0.25 mm/2)$^2\times\pi$) to 0.2 mm$^2$ (=(0.5 mm/2)$^2\times\pi$).

Figure 9:
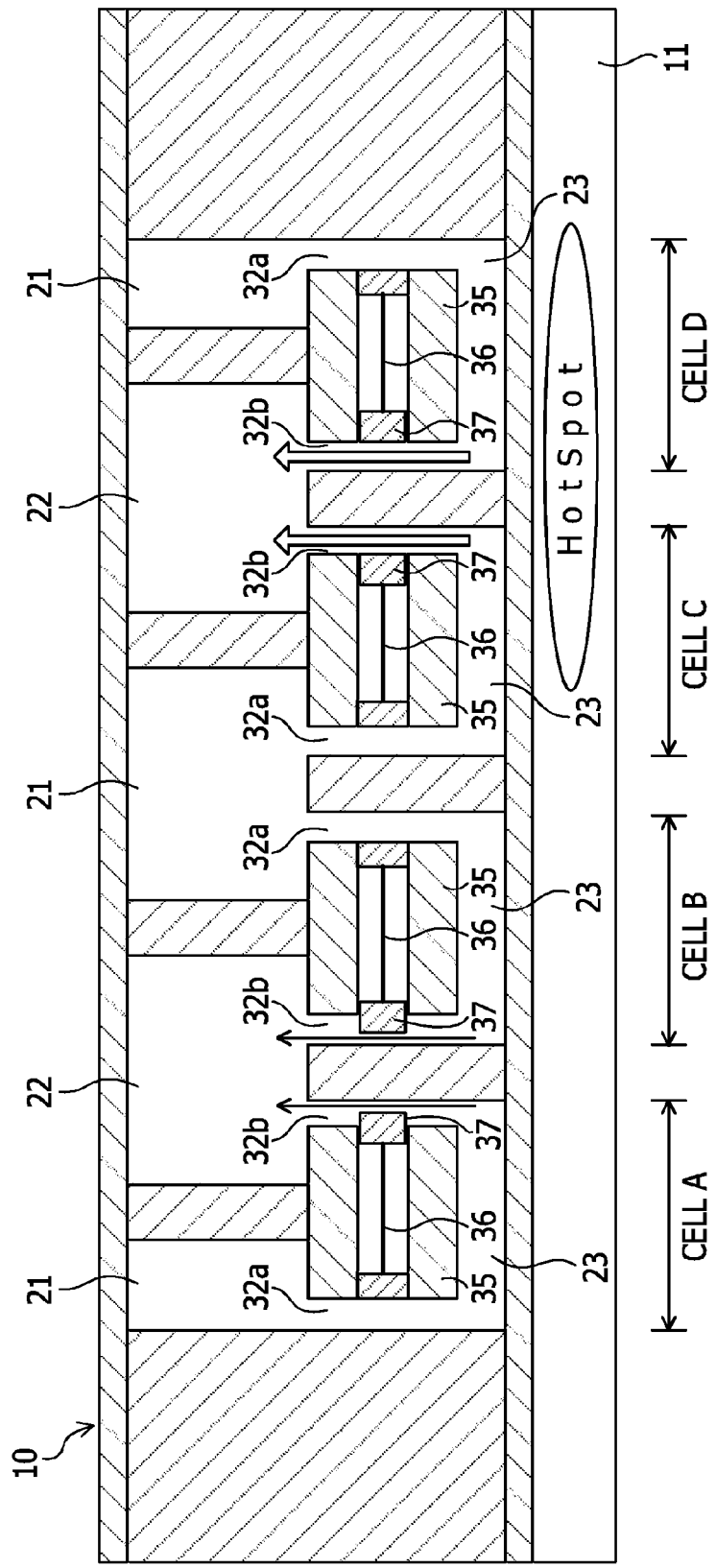
FIG. 9 is a diagram illustrating the cooling device in operation according to the first embodiment.

Hereinafter, the operation of the above-described cooling device 10 is described with reference to a schematic cross-sectional view illustrated in FIG. 9. In FIG. 9, it is assumed that two cells A and B on the left side are disposed in a region where the heat generation density is low, and two cells C and D on the right side are disposed in a region where the heat generation density is high (hot spot).

In the cells A and B disposed in the region where the heat generation density is low, the temperature difference between the coolant flowing through the first communicating passage 32a and the coolant flowing through the second communicating passage 32b is small, and the voltage outputted from the power generating element 35 is low. Thus, the actuator 36 is in the extended state, so that the opening area of the second communicating passage 32b is small, and the flow rate of the coolant flowing through the second communicating passage 32b is low.

On the other hand, in the cells C and D disposed in the region where the heat generation density is high, the temperature difference between the coolant flowing through the first communicating passage 32a and the coolant flowing through the second communicating passage 32b is large, and the voltage outputted from the power generating element 35 is high. Thus, the actuator 36 is contracted, moving the movable plate 37 toward the fixed portion 43a, so that the opening area of the second communicating passage 32b is increased. As a result, the flow rate of the coolant flowing through the second communicating passage 32b is increased, and the heat radiating surface at a portion where the hot spot has occurred is cooled to lower the temperature.

When the temperature of the heat radiating surface is lowered, the voltage outputted from the power generating element 35 is decreased to extend the actuator 36. This causes the movable plate 37 to be moved away from the fixed portion 43a by the elastic force of the thin frame 43b, reducing the opening area of the second communicating passage 32b. As a result, the flow rate of the coolant flowing through the second communicating passage 32b is decreased.

In this way, in the cooling device 10 according to the first embodiment, the opening area of the second communicating passage 32b is automatically regulated in each cell 31 according to the temperature difference between the coolant (cool water) flowing through the first communicating passage 32a and the coolant (hot water) flowing through the second communicating passage 32b. Accordingly, a relatively large amount of the coolant flows through the cells 31 in a region where the hot spot has occurred, while the flow rate of the coolant flowing through the cells 31 in a region where the heat generation density is low is decreased.

This makes it possible to preferentially cool a portion having a high heat generation density, without increasing the flow rate of the coolant supplied from the circulating pump 13 (see FIG. 2). As a result, the load on the circulating pump 13 and the like is reduced, and an advantageous effect of reduction in the electricity consumed by the circulating pump 13 and the like is achieved.

Hereinafter, an example of a method of manufacturing the cooling device 10 according to the first embodiment is described.

Figure 10:
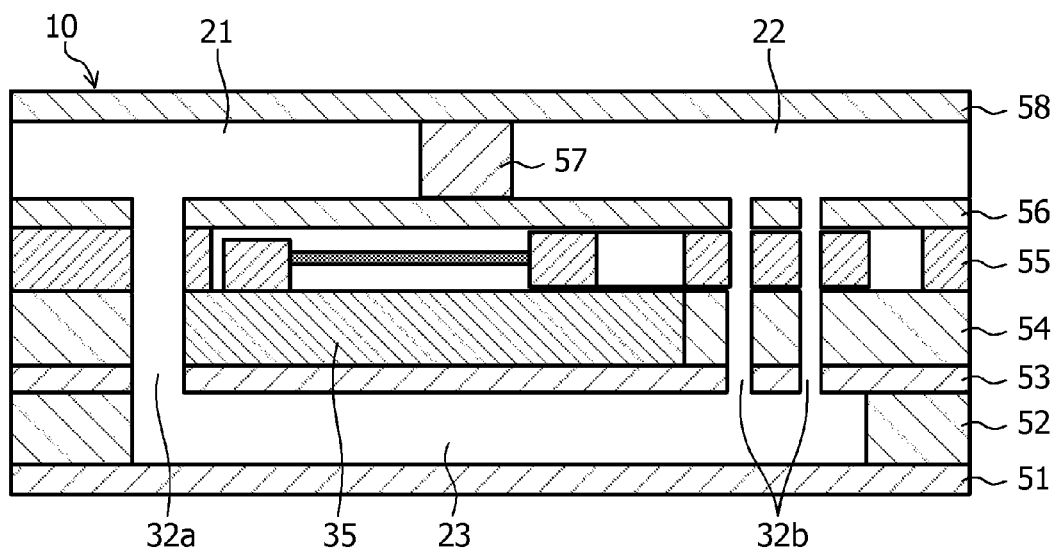
FIG. 10 is a cross-sectional view illustrating an example of a structure of the cooling device according to the first embodiment.

As illustrated in a cross-sectional view of FIG. 10, the cooling device 10 according to the first embodiment may be manufactured by stacking metal plates 51 to 58. FIGS. 11A to 13C illustrate plan views of the metal plates 51 to 58.

Figure 11A:
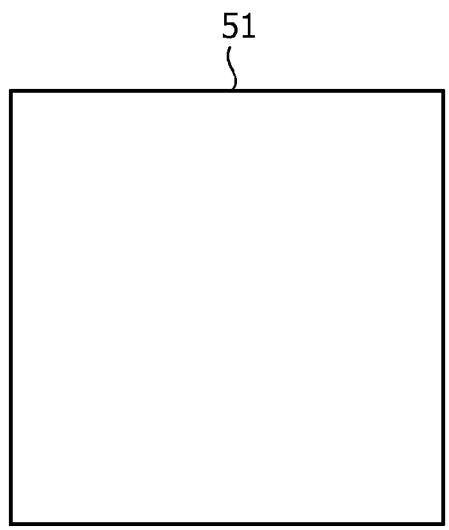
FIGS. 11A to 11C are plan views illustrating metal plates of the cooling device according to the first embodiment.
Figure 11B:
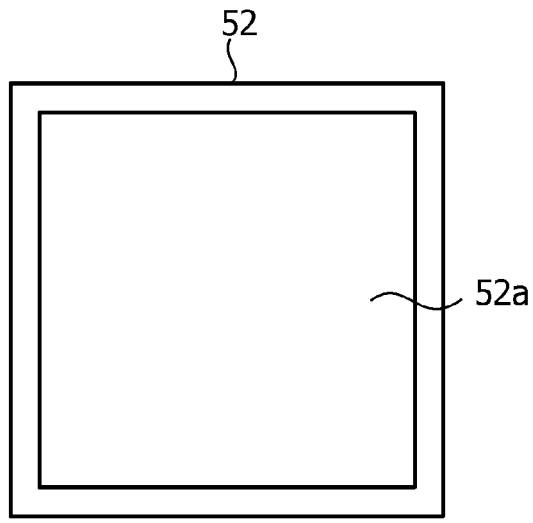
Figure 11C:
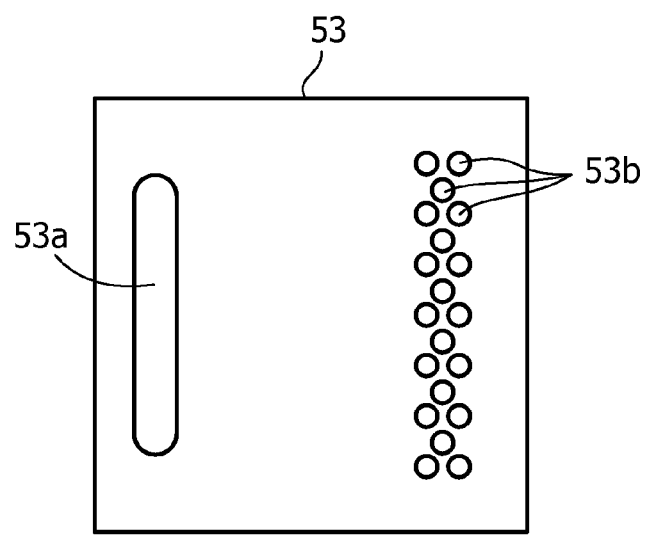
Figure 12A:
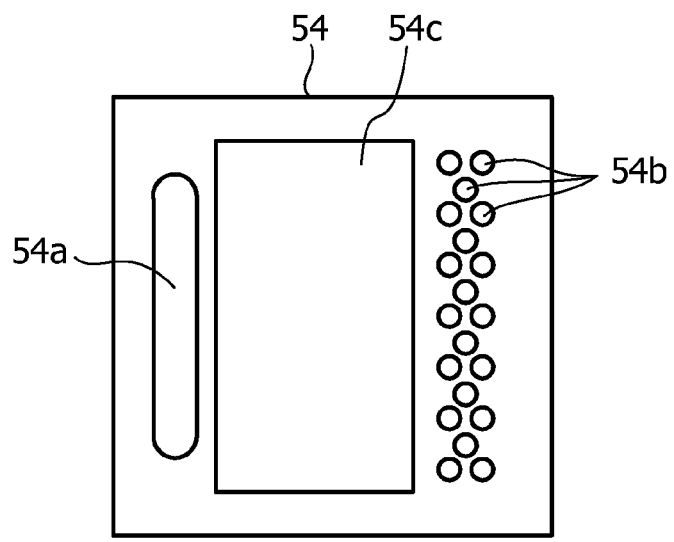
FIGS. 12A to 12C are plan views illustrating metal plates of the cooling device according to the first embodiment.
Figure 12B:
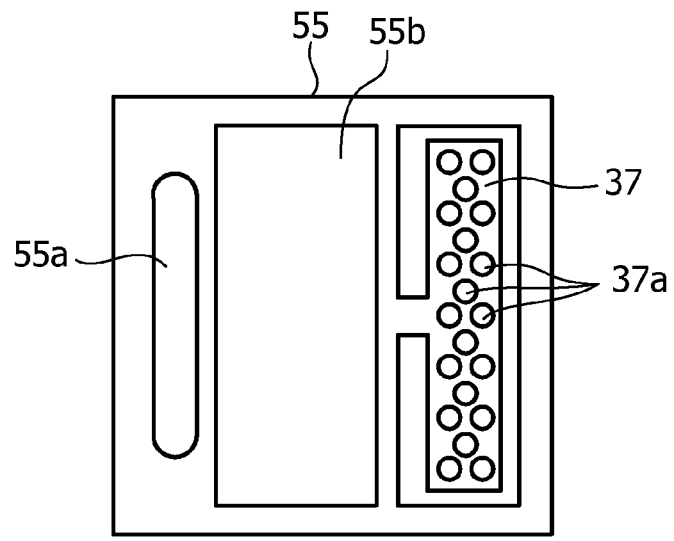
Figure 12C:
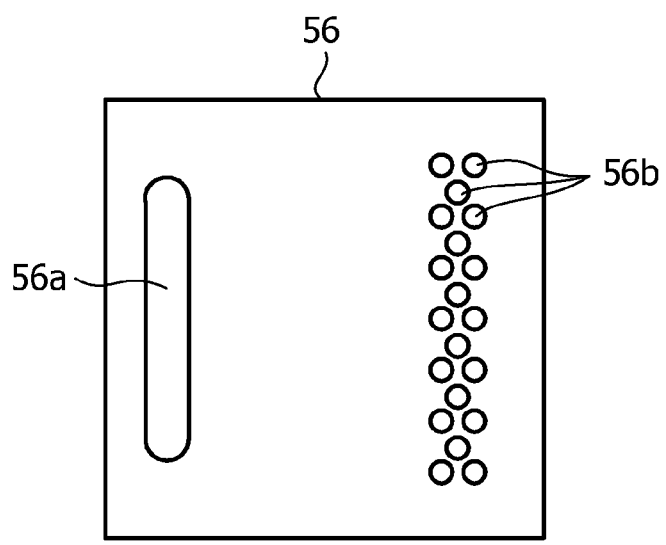
Figure 13A:
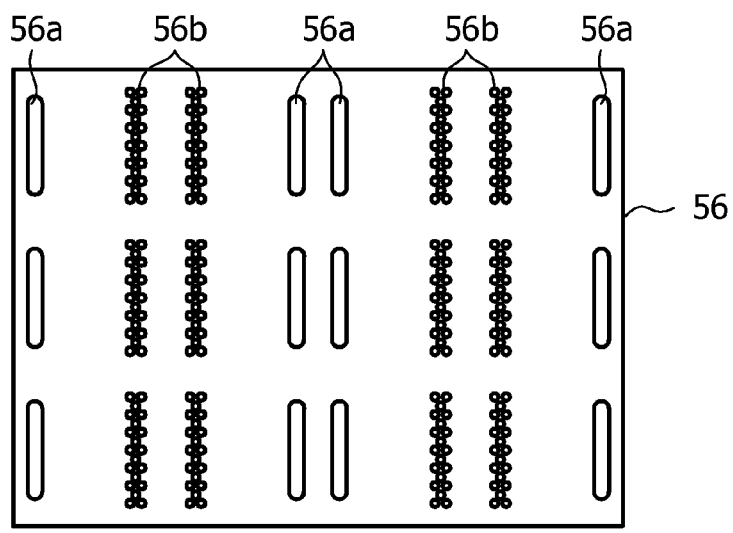
FIGS. 13A to 13C are plan views illustrating metal plates of the cooling device according to the first embodiment.
Figure 13B:
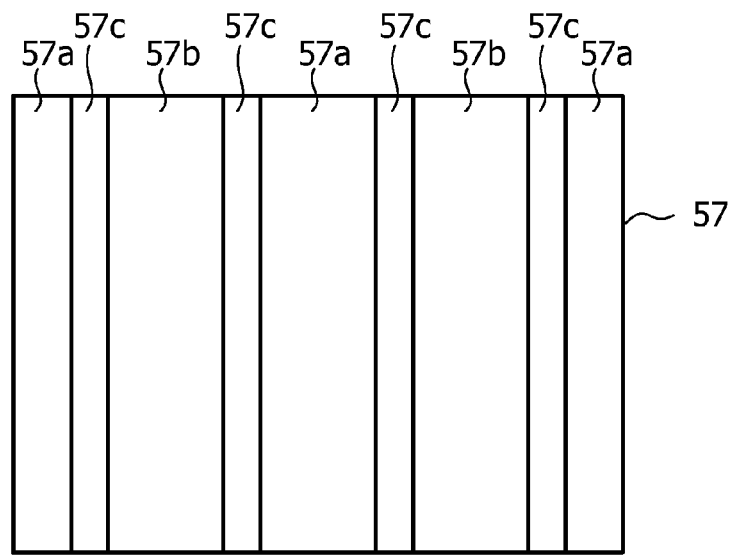
Figure 13C:

Note that FIGS. 11A to 12C illustrate planes of portions corresponding to one cell in the metal plates 51 to 56, and FIGS. 13A to 13C illustrate planes of portions corresponding to twelve cells in the metal plates 56 to 58. In addition, the metal plates 51 to 54 and 56 to 58 are made of copper or a copper alloy, and the metal plate 55 is made of a stainless steel or another metal that has good properties for use as a spring.

The metal plate 51 illustrated in FIG. 11A serves as a bottom plate of the cooling device 10. The metal plate 51 is provided with no opening portions and the like. In addition, as illustrated in FIG. 11B, the metal plate 52 is provided with an opening portion 52a forming the heat exchanging chamber 23. Moreover, as illustrated in FIG. 11C, the metal plate 53 is provided with an opening portion 53a forming the first communicating passage 32a and opening portions 53b forming the second communicating passages 32b. Furthermore, as illustrated in FIG. 12A, the metal plate 54 is provided with an opening portion 54a forming the first communicating passage 32a, opening portions 54b forming the second communicating passages 32b, and an opening portion 54c in which to dispose the power generating element 35.

The metal plate 55 is made of a metal having good properties for use as a spring, as described above. As illustrated in FIG. 12B, the metal plate 55 is provided with an opening portion 55a forming the first communicating passage 32a, an opening portion 55b in which to dispose the fixed portion 43a and the actuator 36, and the movable plate 37 having opening portions 37a.

As illustrated in FIGS. 12C and 13A, the metal plate 56 is provided with an opening portion 56a forming the first communicating passage 32a and opening portions 56b forming the second communicating passages 32b. In addition, as illustrated in FIG. 13B, the metal plate 57 is provided with opening portions 57a forming the cool water passages 21, opening portions 57b forming the hot water passages 22, and patterns 57c forming the separating walls 25. The metal plate 58 illustrated in FIG. 13C serves as a top plate of the cooling device 10.

The cooling device 10 according to the first embodiment may be manufactured by stacking these metal plates 51 to 58 from the lower side.

(Second Embodiment)

Figure 14:
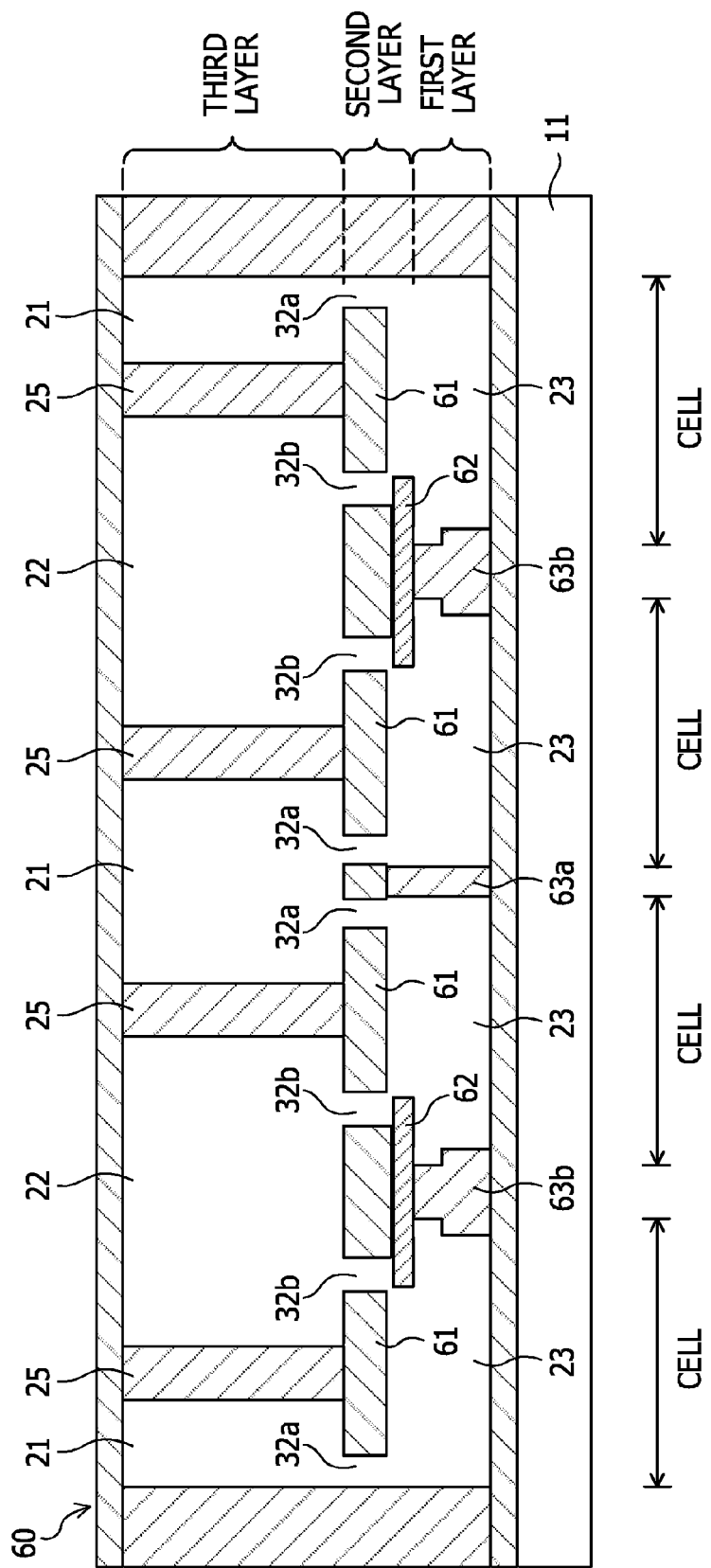
FIG. 14 is a schematic cross-sectional view illustrating an internal structure of a cooling device according to a second embodiment.

FIG. 14 is a schematic cross-sectional view illustrating an internal structure of a cooling device according to a second embodiment.

The cooling device 60 according to the second embodiment is different from the cooling device 10 according to the first embodiment in terms of the structure of the flow regulating mechanism, and is basically the same as the first embodiment in terms of the structures of the other portions. For this reason, in FIG. 14, the same components as those in FIG. 4 are denoted by the same reference signs.

As illustrated in FIG. 14, the inside of the cooling device 60 according to the second embodiment is also divided into three layers in a thickness direction (height direction) like that of the first embodiment. The uppermost layer (third layer) is provided with a cool water passage 21 and a hot water passage 22. The cool water passage 21 and the hot water passage 22 are separated by a separating wall 25.

A separating plate 61 which separates the uppermost layer (third layer) and the lowermost layer (first layer) is disposed in the intermediate layer (second layer). The separating plate 61 is provided with a first communicating passage 32a through which the cool water passage 21 and a heat exchanging chamber 23 communicate with each other, and a second communicating passage 32b through which the heat exchanging chamber 23 and the hot water passage 22 communicate with each other.

In addition, a flow regulating valve 62 which determines an opening area of the second communicating passage 32b is disposed below the separating plate 61 between the second communicating passages 32b adjacent to each other. The flow regulating valve 62 is an example of the flow regulating mechanism. The flow regulating valve 62 is held between the separating plate 61 and a partition wall 63b, which is described below. The detail of the flow regulating valve 62 is described below.

The lowermost layer (first layer) is provided with the heat exchanging chamber 23 in which the cool water is changed to the hot water by heat transmitted from the heat radiating surface of a semiconductor device 11. In addition, partition walls 63a and 63b are provided each between the heat exchanging chambers 23 adjacent to each other.

The partition wall 63a is provided between two cells 31 that share the same cool water passage 21. An upper portion of the partition wall 63a is connected to the separating plate 61. On the other hand, the partition wall 63b is provided between two cells 31 that share the same hot water passage 22. The flow regulating valve 62 is held between the partition wall 63b and the separating plate 61, as described above.

Hereinafter, the flow regulating valve 62 is described. The flow regulating valve 62 is formed of a shape memory material and has a flat-plate shape as illustrated in FIG. 14 when the temperature of the coolant in the heat exchanging chamber 23 is lower than a certain temperature (transformation temperature). At this time, the inlet (lower side) of the second communicating passage 32b is substantially closed by the flow regulating valve 62.

On the other hand, when the temperature of the coolant in the heat exchanging chamber 23 becomes equal to or higher than the certain temperature, the flow regulating valve 62 is transformed into a pre-memorized shape. Here, when the temperature of the coolant in the heat exchanging chamber 23 becomes equal to or higher than the certain temperature, the flow regulating valve 62 is transformed into a shape in which the opposite ends are bent downward. In this way, the inlet of the second communicating passage 32b is opened.

Figure 15:
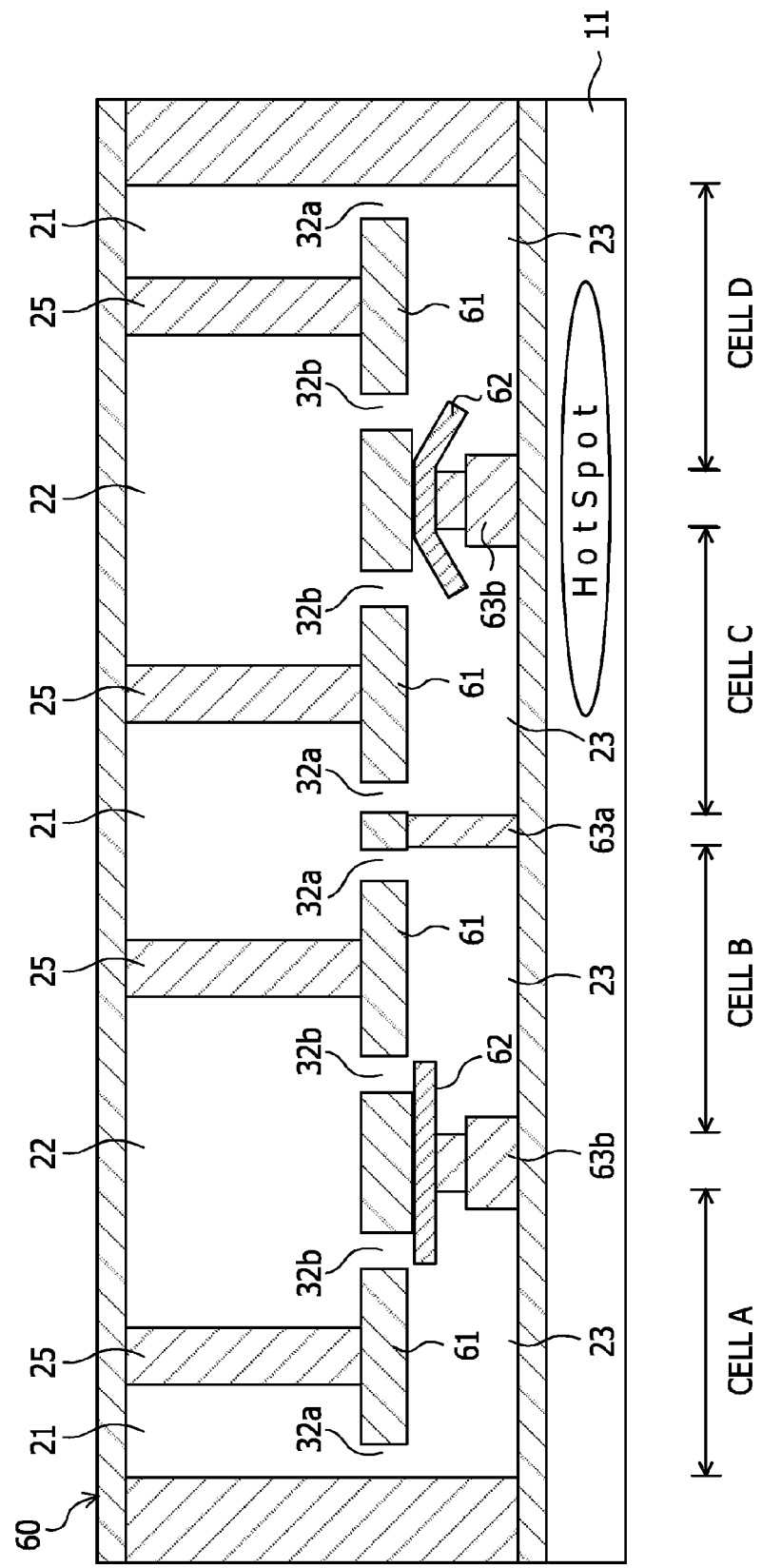
FIG. 15 is a diagram illustrating the cooling device in operation according to the second embodiment.

Hereinafter, the operation of the aforementioned cooling device 60 is described with reference to a schematic view illustrated in FIG. 15. In FIG. 15, it is assumed that two cells A and B on the left side are disposed in a region where the heat generation density is low, and two cells C and D on the right side are disposed in a region where the heat generation density is high (hot spot).

In the cells A and B disposed in the region where the heat generation density is low, the temperature of the coolant in the heat exchanging chamber 23 is low, so that the inlet of the second communicating passage 32b is substantially closed by the flow regulating valve 62. In such a state, the flow rate of the coolant flowing through the second communicating passage 32b is low.

On the other hand, in the cells C and D disposed in the region where the heat generation density is high, the temperature of the coolant in the heat exchanging chamber 23 is increased. When the temperature of the coolant in the heat exchanging chamber 23 then becomes equal to or higher than the certain temperature, the flow regulating valve 62 is transformed into the pre-memorized shape. In other words, the flow regulating valve 62 is transformed into the shape in which the opposite ends are bent downward, as illustrated in FIG. 15. In this way, the flow rate of the coolant flowing through the second communicating passage 32b is increased to cool, and lower the temperature of, the heat radiating surface of a portion where the hot spot has occurred.

Once the temperature of the heat radiating surface is lowered, the flow regulating valve 62 is transformed into the flat-plate shape, and the inlet of the second communicating passage 32b is substantially closed by the flow regulating valve 62. As a result, the flow rate of the coolant flowing through the second communicating passage 32b is decreased.

In this way, in the cooling device 60 according to the second embodiment, the flow rate of the coolant flowing through the second communicating passage 32b is automatically regulated in each cell 31 according to the temperature of the coolant in the heat exchanging chamber 23. Accordingly, a relatively large amount of the coolant flows through the cells 31 in a region where the hot spot has occurred, while the flow rate of the coolant flowing through the cells 31 in a region where the heat generation density is low is decreased.

Like the first embodiment, this makes it possible to preferentially cool a portion having a high heat generation density, without increasing the flow rate of the coolant supplied from the circulating pump 13 (see FIG. 2). As a result, an advantageous effect of reduction in the electricity consumed by the circulating pump 13 and the like is achieved.

Note that although the shape memory material is used for the flow regulating valve 62 in the second embodiment, a bimetal may be used instead for the flow regulating valve 62.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling device that is thermally connected to a heat source and cools the heat source by means of a heat medium flowing inside the cooling device, comprising:
   a first passage wherein the heat medium before being heated by the heat source flows through the first passage;
   a second passage wherein the heat medium after being heated by the heat source flows through the second passage;
   a heat exchanging chamber wherein in the heat exchanging chamber, the heat medium is heated by heat generated by the heat source;
   a first communicating passage provided in the heat exchanging chamber and wherein through the first communicating passage, the first passage and the heat exchanging chamber communicate with each other;
   a second communicating passage provided in the heat exchanging chamber and wherein through the second communicating passage, the heat exchanging chamber and the second passage communicate with each other; and
   a flow regulating mechanism provided in the heat exchanging chamber and that regulates, according to a temperature, a flow rate of the heat medium flowing through at least one of the first communicating passage and the second communicating passage,
   wherein the flow regulating mechanism comprises:
      a lower plate provided in such a manner that a lower face of the lower plate is in contact with the heat exchanging chamber;
      a power generating element, provided over an upper face of the lower plate and between the first communicating passage and the second communicating passage, that generates electricity by using a temperature difference between the heat medium flowing through the first communicating passage and the heat medium flowing through the second communicating passage; and
      an actuator, provided over the power generating element, that moves a movable plate over the power generating element by the electricity supplied from the power generating element.

2. The cooling device according to claim 1, further comprising:
   a plurality of cells each including the heat exchanging chamber, the first communicating passage and the second communicating passage,
   wherein the first passage is shared by a first cell of the plurality of cells and a second cell of the plurality of cells which are adjacent with each other and the second passage is shared by the second cell and a third cell of the plurality of cells which is adjacent to the second cell at an opposite side to the first cell.

3. The cooling device according to claim 1, wherein the cooling device is divided into a first layer, a second layer, and a third layer that are arranged in this order from a side of the heat source, wherein the heat exchanging chamber is disposed in the first layer, wherein the first communicating passage, the second communicating passage, and the flow regulating mechanism are disposed in the second layer, and wherein the first passage and the second passage are disposed in the third layer.

4. The cooling device according to claim 2, wherein the actuator is an artificial muscle that is contracted by application of a voltage.

5. The cooling device according to claim 1, wherein the flow regulating mechanism comprises a shape memory member or a bimetal that is changed in shape by a temperature of the heat medium in the heat exchanging chamber.

6. The cooling device according to claim 1, wherein the heat source is a semiconductor device.

7. An electronic apparatus that includes an electronic component including a heat source and a cooling device thermally connected to the heat source, wherein the cooling device comprising:
- a first passage wherein a heat medium before being heated by the heat source flows through the first passage;
- a second passage wherein the heat medium after being heated by the heat source flows through the second passage;
- a heat exchanging chamber wherein in the heat exchanging chamber, the heat medium is heated by heat generated by the heat source;
- a first communicating passage provided in the heat exchanging chamber and wherein through the first communicating passage, the first passage and the heat exchanging chamber communicate with each other;
- a second communicating passage provided in the heat exchanging chamber and wherein through the second communicating passage, the heat exchanging chamber and the second passage communicate with each other; and
- a flow regulating mechanism provided in the heat exchanging chamber and that regulates, according to a temperature, a flow rate of the heat medium flowing through at least one of the first communicating passage and the second communicating passage,
- wherein the flow regulating mechanism comprises:
  - a lower plate provided in such a manner that a lower face of the lower plate is in contact with the heat exchanging chamber;
  - a power generating element, provided over an upper face of the lower plate and between the first communicating passage and the second communicating passage, that generates electricity by using a temperature difference between the heat medium flowing through the first communicating passage and the heat medium flowing through the second communicating passage; and
  - an actuator, provided over the power generating element, that moves a movable plate over the power generating element by the electricity supplied from the power generating element.

8. The electronic apparatus according to claim 7, further comprising:
- a heat dissipating device disposed at a position separated from the cooling device; and
- a first pipe and a second pipe each that connects the cooling device and the heat dissipating device; wherein the heat medium circulates between the cooling device and the heat dissipating device through the first pipe and the second pipe.

9. The electronic apparatus according to claim 7, wherein the heat source is a semiconductor device.

10. The cooling device according to claim 1, wherein the movable plate includes a plurality of first holes and extends or contracts by the actuator.

11. The cooling device according to claim 10, wherein the flow regulating mechanism further comprises an upper plate including a plurality of second holes which overlap the plurality of first holes partially or fully.

12. The electronic apparatus according to claim 7, further comprising:
- a plurality of cells each including the heat exchanging chamber, the first communicating passage and the second communicating passage,
- wherein the first passage is shared by a first cell of the plurality of cells and a second cell of the plurality of cells which are adjacent with each other and the second passage is shared by the second cell and a third cell of the plurality of cells which is adjacent to the second cell at an opposite side to the first cell.

13. The electronic apparatus according to claim 7, wherein the movable plate includes a plurality of first holes and extends or contracts by the actuator.

14. The electronic apparatus according to claim 13, wherein the flow regulating mechanism further comprises an upper plate including a plurality of second holes which overlap the plurality of first holes partially or fully.

* * * * *